United States Patent
Hsu

(12) 
(10) Patent No.: US 8,031,488 B2
(45) Date of Patent: Oct. 4, 2011

(54) CIRCUIT PROTECTION ELEMENT AND A CIRCUIT BOARD WITH THE CIRCUIT PROTECTION ELEMENT

(75) Inventor: Jung-Hui Hsu, Chung-Ho (TW)

(73) Assignee: Powertech Industrial Co., Ltd., Taipei Hsien (TW)

(*) Notice: Subject to any disclaimer, the term of this patent is extended or adjusted under 35 U.S.C. 154(b) by 1057 days.

(21) Appl. No.: 11/898,221

(22) Filed: Sep. 11, 2007

(65) Prior Publication Data

US 2009/0002962 A1 Jan. 1, 2009

(30) Foreign Application Priority Data

Jun. 27, 2007 (TW) ................. 96123267 A

(51) Int. Cl.
*H01H 85/20* (2006.01)
*H02B 1/18* (2006.01)

(52) U.S. Cl. .................. 361/833; 361/811; 361/823

(58) Field of Classification Search .......... 361/752–753, 361/816, 818
See application file for complete search history.

(56) References Cited

U.S. PATENT DOCUMENTS

| 4,492,946 A | * | 1/1985 | Loescher | ............. 337/365 |
| 6,024,586 A | * | 2/2000 | Kumagai | ............. 439/95 |
| 7,094,076 B2 | * | 8/2006 | Hatakeyama | ............. 439/97 |

* cited by examiner

*Primary Examiner* — Tuan T Dinh
(74) *Attorney, Agent, or Firm* — Rosenberg, Klein & Lee

(57) ABSTRACT

A circuit protection element and a circuit board with the circuit protection element are disclosed. The circuit protection element includes a metal base, and at least one opening slot located at the metal base. The metal base forms a positioning portion. One end of the metal base is fastened onto a circuit board. The bottom of the free end of the metal base contacts a conducting point located on the circuit board to make the circuit be in a conducting status. When the current is overloaded or the circuit is over-heated, the bottom of the free end of the metal base is heated so that the bottom of the free end of the metal base separates from the conducting point and the positioning portion is wedged with the circuit board. Thereby, the circuit becomes a broken circuit. The circuit protection element can prevent the electronic components from being burnt down.

5 Claims, 6 Drawing Sheets

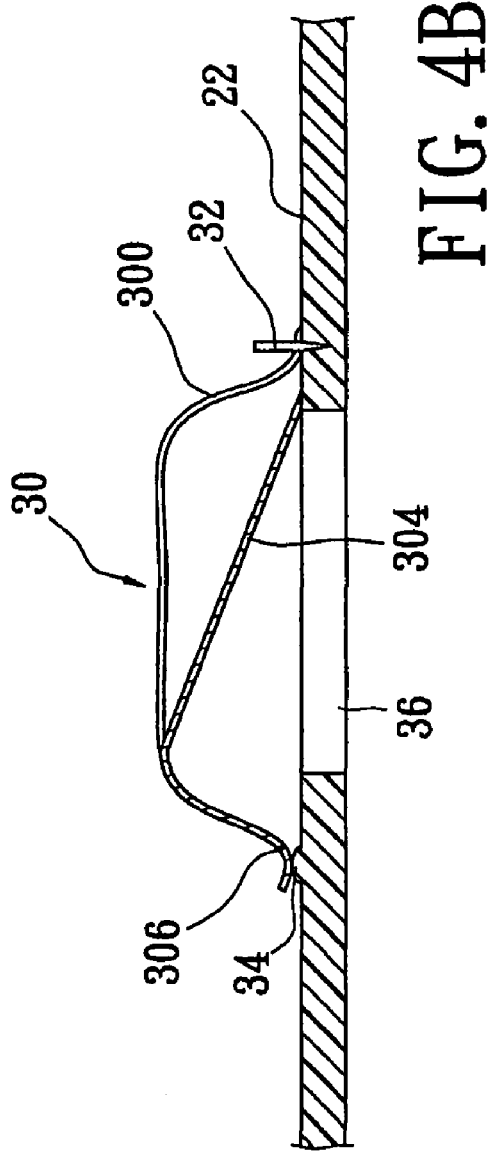
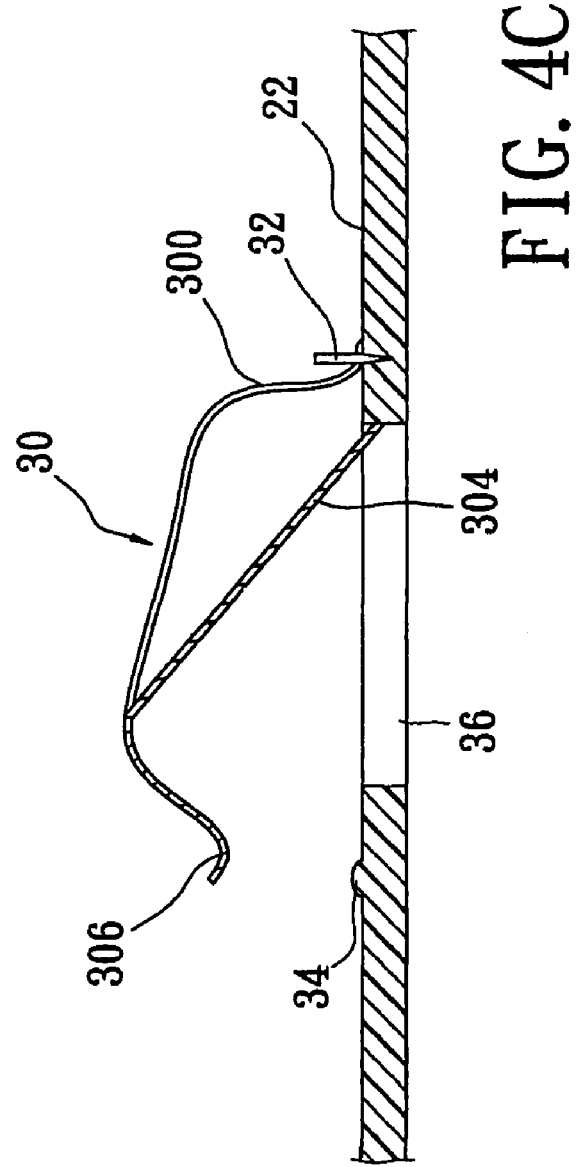

CIRCUIT PROTECTION ELEMENT AND A CIRCUIT BOARD WITH THE CIRCUIT PROTECTION ELEMENT

BACKGROUND OF THE INVENTION

1. Field of the Invention

The present invention relates to a circuit protection element and a circuit board with the circuit protection element. In particular, this invention relates to a circuit protection element and a circuit board with the circuit protection element that the circuit protection element will not be burnt down.

2. Description of the Related Art

Electrical power is an essential for everybody. The equipments operated by electrical power appear in our daily life, including household, traffic, education, and entertainment, etc.

Electrical power and the related equipments make everyone be more comfortable. However, how to use the electrical power safely is a concerned issue.

Generally, there is an electrical power control switch in the power supply circuit. The electrical power control switch usually is turned on, and a fuse or a circuit breaker is located on the power supply circuit. When the electrical equipments on the circuit are too much so that the current is overloaded or the circuit is over-heated, the fuse melts or the circuit breaker breaks away and the circuit becomes a broken circuit.

Currently, the electronic devices (such as a commercial computer, or a household computer, or the related devices), utilizes the temporary voltage ripple suppressing characteristic to protect the sensitive circuit components. FIG. 1 shows a schematic diagram of the semi-temporary voltage ripple suppressing system of the prior art. The semi-temporary voltage ripple suppressing system merely can solve the slight failure. It can solve the heavy over-voltage problem occurred on the line wire to neutral wire (L-N), the line wire to ground wire (L-G) or the neutral wire to ground wire (N-G) due to the neutral wire (N) fails, the ground wire (G) or the repeated current pulse (such as a flashing lightening). The related ripple suppressing system is composed of a variety of metal oxide varistors (MOV) 12 and temperature fuse 10. The metal oxide varistor 12 is made of composite ceramic material (such as zinc oxide combined with a non-crystal material) and is a non-linear device. The metal oxide varistor 12 keeps the voltage in narrowed band (the varistor voltage). When the metal oxide varistor 12 continuously receives the high voltage or the received high voltage is larger than the specification, the temperature of the circuit is high or the circuit will be burnt down. The temperature in the circuit will affect characteristics of the electronic components. The high temperature makes the electronic component be operated abnormally, the circuit fail, or the electronic components be burnt down. Therefore, the temperature fuse or the circuit breaker usually is located in the circuit. When the electrical equipments on the circuit are too much so that the current is overloaded or the circuit is over-heated, the temperature fuse melts or the circuit breaker breaks away and the circuit becomes a broken circuit.

SUMMARY OF THE INVENTION

One particular aspect of the present invention is to provide a circuit protection element and a circuit board with the circuit protection element. When the current in the circuit on the circuit board is overloaded and the circuit is over-heated, the circuit protection element is started to break the circuit and prevent the electronic components from being burnt down due to the electronic components is over-heated. After the circuit protection element is started, the circuit protection element cannot automatically recover. Therefore, the user's safety is ensured.

The circuit protection element includes a metal base, and at least one opening slot located at the metal base. The metal base forms a flexible positioning portion. One end of the metal base is fastened onto a circuit board. The bottom of the free end of the metal base contacts a conducting point located on the circuit board to make the circuit be in a conducting status. When the current is overloaded or the circuit is over-heated, the bottom of the free end of the metal base is heated so that the bottom of the free end of the metal base separates from the conducting point and the positioning portion wedged with the circuit board. Thereby, the circuit becomes a broken circuit.

The present invention also provides a circuit board with the circuit protection element. The circuit board with the circuit protection element includes a plurality of electronic components located at the circuit board. The electronic components form a circuit loop and a power supplies the electric power to the circuit board. The circuit board with the circuit protection element also includes a circuit protection element located in the circuit loop and electrically connected with the circuit board. Thereby, when the temperature of the circuit loop detected by the circuit protection element reaches to a threshold, the circuit protection element is started to separate the connection between the power and the circuit loop.

The present invention has the following characteristics. After the circuit protection element is started, the circuit protection element cannot recover automatically or manually. The electronic device has to be shipped back the factory and be repaired. The problem of the electronic device being damaged after the user recovers the circuit protection element automatically or manually due to some electronic components have been damaged is avoided. The user's safety is ensured. The structure of the circuit protection element is simple, the assembling process is easy, the assembling time is reduced, and the cost is decreased.

For further understanding of the invention, reference is made to the following detailed description illustrating the embodiments and examples of the invention. The description is only for illustrating the invention and is not intended to be considered limiting of the scope of the claim.

BRIEF DESCRIPTION OF THE DRAWINGS

The drawings included herein provide a further understanding of the invention. A brief introduction of the drawings is as follows:

FIG. 4B is a side view of the dual-metal flake of the present invention being not active;

FIG. 4C is a side view of the dual-metal flake of the present invention being active;

DETAILED DESCRIPTION OF THE PREFERRED EMBODIMENTS

When the varistor (such as the metal oxide varistor, MOV) is damaged and the high temperature is generated or a high voltage is continuously exerted on the varistor so that a firing phenomenon occurs, the components and the circuits located around the varistor will be damaged.

Figure 1:
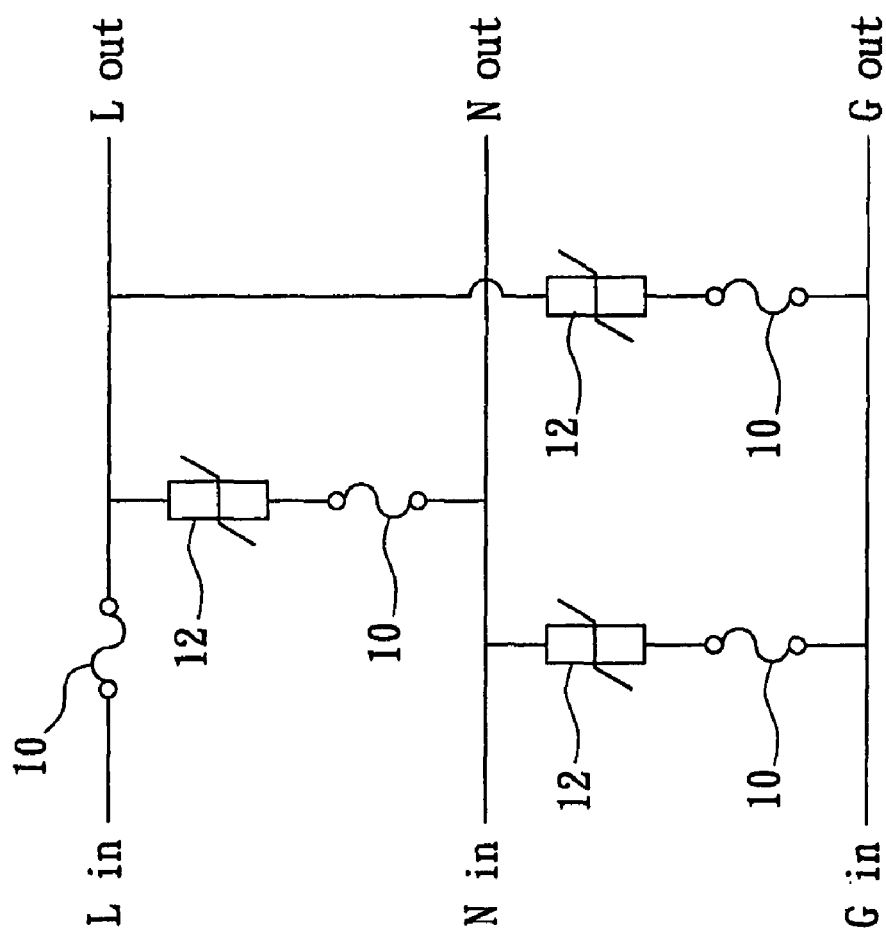
FIG. 1 is a schematic diagram of the semi-temporary voltage ripple suppressing system of the prior art.
Figure 2:
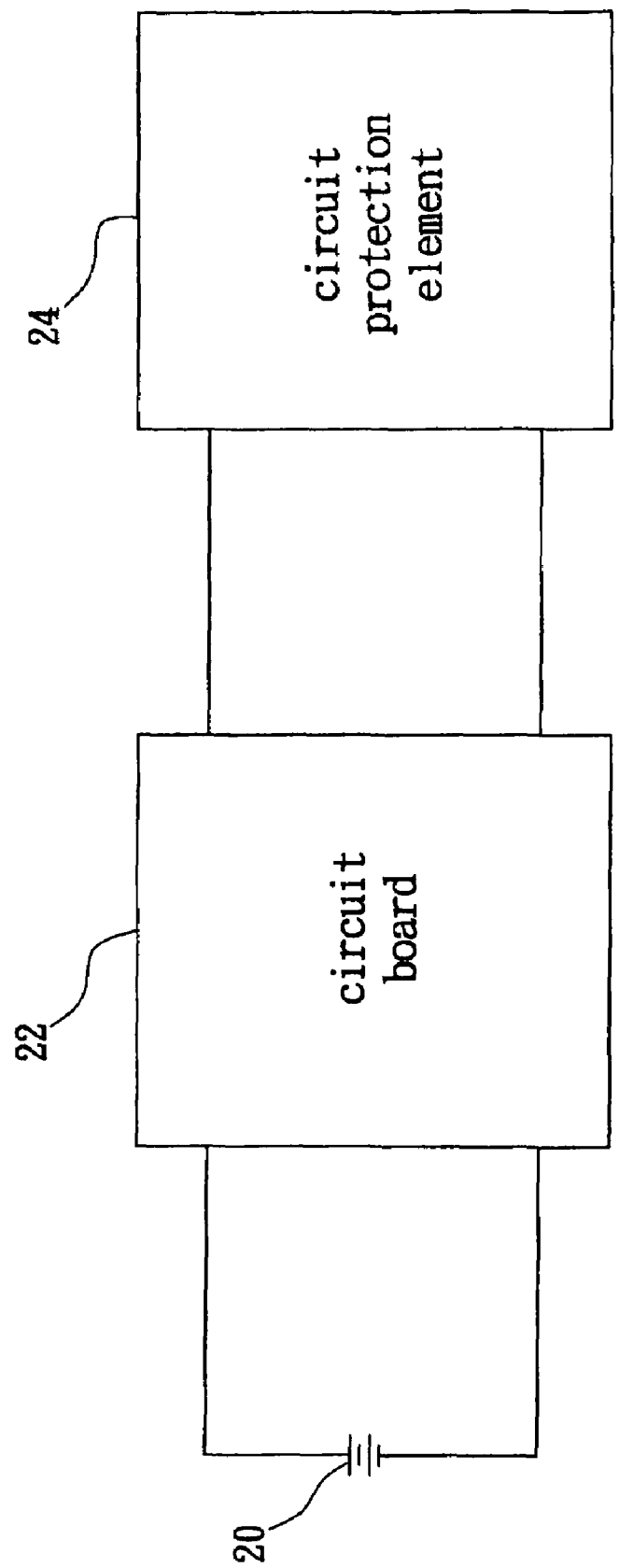
FIG. 2 is a schematic diagram of the circuit board with the circuit protection element of the present invention.

Reference is made to FIG. 2, which shows a schematic diagram of the circuit board with the circuit protection element of the present invention. The circuit board with the circuit protection element includes a power 20, a circuit board 22, and a circuit protection element 24.

The circuit board 22 includes a plurality of electronic components. The electronic components form a circuit loop. The power 20 supplies the electric power to the circuit loop composed by the electronic components located at the circuit board 22 so that the circuit loop operates normally. The circuit protection element 24 is located on the circuit board 22 and in the circuit loop. Thereby, when the temperature of the circuit loop detected by the circuit protection element 24 reaches to a threshold, the circuit protection element 24 is started to separate the connection between the power 20 and the circuit loop.

The circuit protection element 24 is a low temperature metal element or a dual-metal flake. The low temperature metal element is made of low temperature metal material. The present invention utilizes the characteristic of different metals having different coefficients of expansion to combine two kinds or over than two kinds metals into a metal flake. By utilizing the characteristic of different metals having different coefficients of expansion, the deformations for different metals are different within the same temperature variation.

When the circuit protection element 24 is the low temperature metal element, the low temperature metal element is welded or riveted on the circuit board 22 and is tightly attached on the electronic component of the circuit board 22.

When the circuit protection element 24 is the dual-metal flake, one end of the dual-metal flake is riveted onto the circuit board 22 or fastened onto the circuit board 22 by using the method that has the same function as the rivet. The bottom of the free end of the dual-metal flake contacts a conducting point located on the circuit board 22 to keep the circuit in a conducting status.

Figure 3B:
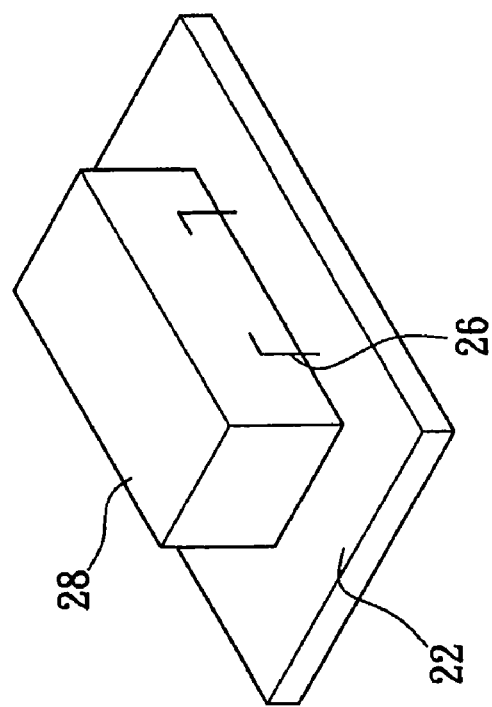
FIG. 3B is a side view of the low temperature metal element of the first embodiment of the present invention being active.
Figure 3A:
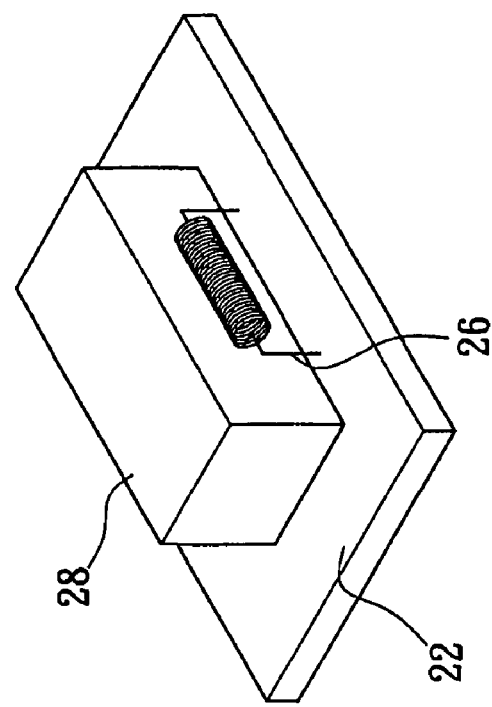
FIG. 3A is a side view of the low temperature metal element of the first embodiment of the present invention being not active.

How to implement the circuit protection element 24 on the circuit board 22 is illustrated. Reference is made to FIGS. 3A and 3B. FIGS. 3A and 3B are side views of the low temperature metal element of the first embodiment of the present invention implemented on the circuit board. The circuit board with the circuit protection element includes a plurality of electronic components 28 located on the circuit board 22, a power (not shown in the figure), and a low temperature metal element 26.

In order to illustrate the present invention easily, one electronic component 28 is disclosed in FIG. 3A or 3B. The number of the electronic component 28 is not limited to one. When the circuit board 22 has a plurality of electronic components 28, the electronic components 28 forms a circuit loop. The power (not shown in the figure) provides electric power to the circuit loop composed by the electronic components 28 of the circuit board 22 so that the electronic components 28 can normally operate on the circuit board 22.

The low temperature metal element 26 is welded or riveted on the circuit board 22 and is tightly attached on the electronic component 28 of the circuit board 22. The low temperature metal element 26 is made of low temperature metal material. The temperature range that can be sensed by the low temperature metal material is between 100° C. and 600° C.

FIG. 3A shows a side view of the low temperature metal element of the first embodiment of the present invention being not active. When the temperature of the circuit loop detected by the low temperature metal element 26 does not reach to a threshold (the temperature range that can be sensed by the low temperature metal material), the circuit loop of the circuit board 22 normally operates.

FIG. 3B shows a side view of the low temperature metal element of the first embodiment of the present invention being active. When the temperature of the circuit loop detected by the low temperature metal element 26 reaches to the threshold, the low temperature metal element 26 is burnt down to separate the connection between the power and the circuit board. Thereby, the power does not supply electric power to the circuit loop and the electronic components will not be burnt down.

Figure 4A:
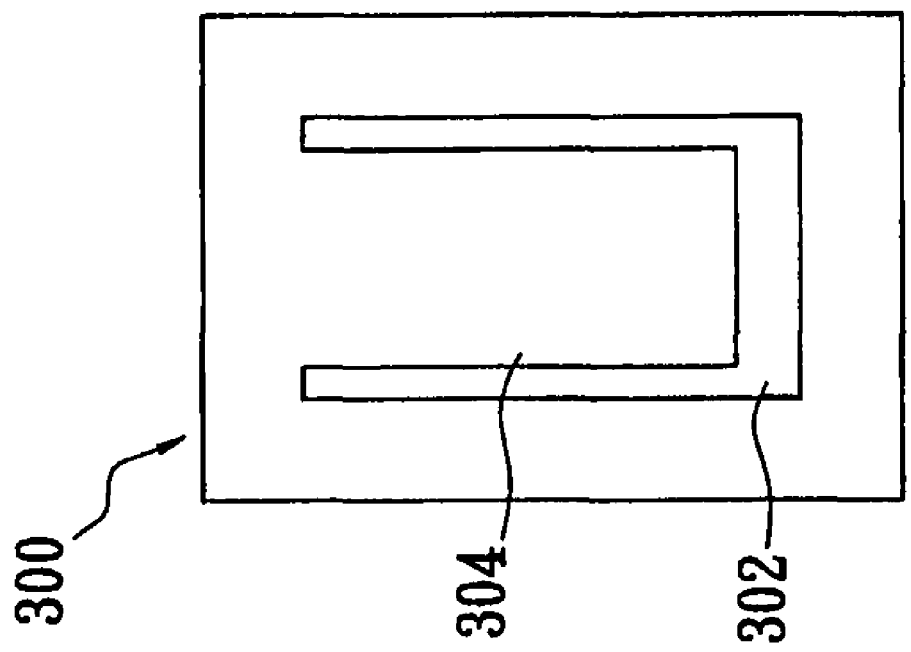
FIG. 4A is a top view of the circuit protection element of the present invention.

Reference is made to FIG. 4A, which shows a top view of the circuit protection element of the present invention. FIGS. 4B and 4C are a side view of the circuit protection element of the second embodiment of the present invention.

The circuit protection element in FIG. 4A is a dual-metal flake 30. The dual-metal flake 30 includes a metal base 300, and at least one opening slot 302 located at the metal base 300. The metal base 300 forms a flexible positioning portion 304.

Reference is made to FIGS. 4B and 4C. FIG. 4B is a side view of the dual-metal flake of the present invention being not active. In FIGS. 4B and 4C, the dual-metal flake 30 is located on the circuit board 22.

The circuit board 22 has an opening 36 and a conducting point 34. One end 308 of the metal base 300 of the dual-metal flake 30 is fastened onto the circuit board 22 by using a rivet 32 or a method having the same function. The bottom of the free end 306 of the metal base 300 contacts the conducting point 34 located on the circuit board 22 to make the circuit be in a conducting status. When the temperature of the circuit loop detected by the dual-metal flake 30 does not reach to a threshold, the circuit loop normally operates.

FIG. 4C shows a side view of the dual-metal flake of the present invention being active. When the current is overloaded or the circuit is over-heated, the bottom of the free end 306 of the metal base 300 is heated by the heat transmitted from the conducting point 34 so that the bottom of the free end 306 of the metal base 300 is separated from the conducting point 34. Both the free end 306 of the metal base 300 and the whole dual-metal flake 30 are heated. When the free end 306 of the metal base 300 is heated and is separated from the conducting point 34, the positioning portion 304 also warps in a direction that is depart away from the circuit board 22. However, because the dual-metal flake 30 has two kinds of metals, the warping force of the bottom of the free end 306 of the metal base 300 is larger than the warping force of the positioning portion 304, the positioning portion 304 does not wrap in a direction that is depart away from the circuit board 22 and wraps in a direction that faces forward to the opening 36 of the circuit board. Thereby, the positioning portion 304 passes through the opening 36 and is wedged with the circuit board 22, and the circuit becomes a broken circuit.

Figure 5B:
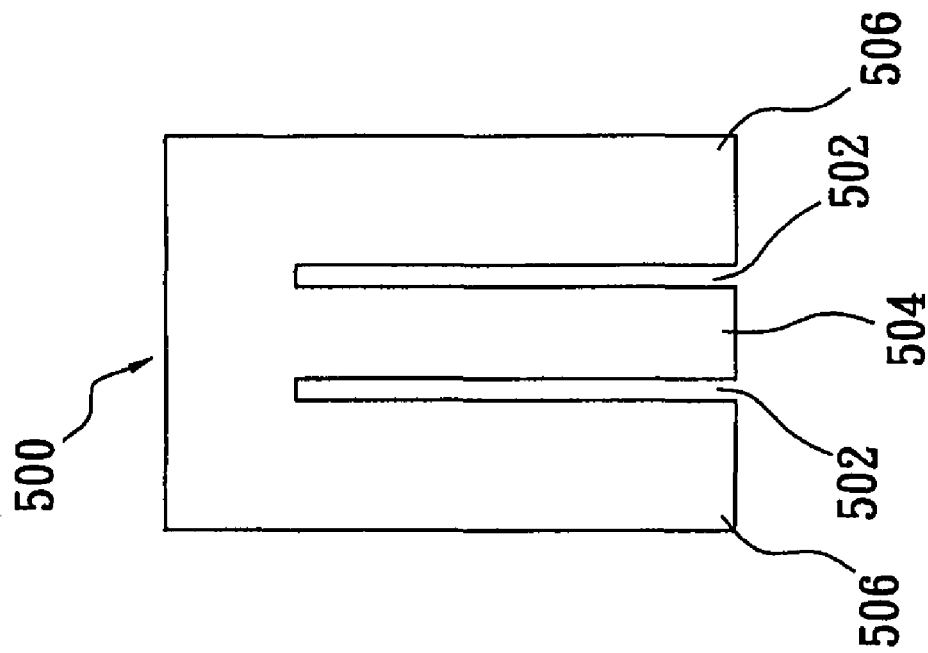
FIG. 5B is a top view of the dual-metal flake of the third embodiment of the present invention.
Figure 5A:
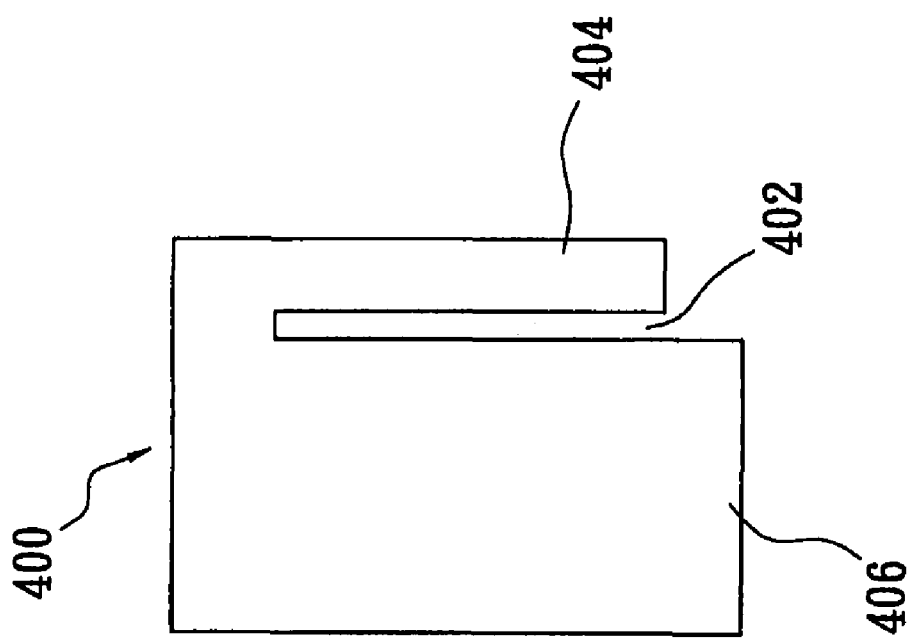
FIG. 5A is a top view of the dual-metal flake of the second embodiment of the present invention.

When the dual-metal flake 30 is implemented, the appearance of the dual-metal flake 30 can be designed as in FIGS. 5A and 5B. However, the appearance of the dual-metal flake 30 is not limited to above.

The difference of the appearance of the dual-metal flake in FIGS. 5A and 5B and in FIG. 4A is the opening slot of the metal base. In FIG. 4A, the shape of the opening slot 302 of the metal base is U-shaped. In FIG. 5A, the shape of the opening slot 402 of the metal base is I-shaped. In FIG. 5B, the shape of the opening slot 502 of the metal base is double I-shaped.

The operation for the dual-metal flake in FIGS. 5A and 5B is illustrated. The connection between the dual-metal flake and the circuit is the same as the previous description. Therefore, the circuit board is not displayed on the figures.

FIG. 5A is a top view of the dual-metal flake of the second embodiment of the present invention. When the temperature of the circuit loop detected by the dual-metal flake reaches to the threshold, the free end 406 of the metal base 400 warps in a direction that departs away from the circuit board 22 due to the dual-metal flake is heated. The circuit board 22 has an opening that corresponds to the flexible positioning portion 404 of the metal base 400. The positioning portion 404 passes through the opening and is wedged with the circuit board, and the circuit becomes a broken circuit. Therefore, the power (not shown in the figure) does not supply the electric power to the circuit loop and the electronic components are not burnt down.

FIG. 5B is a top view of the dual-metal flake of the third embodiment of the present invention. When the temperature of the circuit loop detected by the dual-metal flake reaches to the threshold, the free end 506 of the metal base 500 warps in a direction that departs away from the circuit board due to the dual-metal flake is heated. The circuit board has an opening that corresponds to the flexible positioning portion 504 of the metal base 500. The positioning portion 504 is wedged with the circuit board, and the circuit becomes a broken circuit. Therefore, the power (not shown in the figure) does not supply the electric power to the circuit loop and the electronic components are not burnt down.

The present invention has the following characteristics. After the circuit protection element is started, the circuit protection element cannot recover automatically or manually. The electronic device has to be shipped back the factory and be repaired. The problem of the electronic device being damaged after the user recovers the circuit protection element automatically or manually due to some electronic components have been damaged is avoided. The user's safety is ensured. The structure of the circuit protection element is simple, the assembling process is easy, the assembling time is reduced, and the cost is decreased.

The description above only illustrates specific embodiments and examples of the invention. The invention should therefore cover various modifications and variations made to the herein-described structure and operations of the invention, provided they fall within the scope of the invention as defined in the following appended claims.

What is claimed is:

1. A circuit protection element for a circuit loop on a circuit board, comprising:
   a metal base, being a dual-metal flake; and
   at least one opening slot located at the metal base having a first end and a second end, wherein the metal base forms a flexible positioning portion;
   wherein the first end of the metal base is fastened onto the circuit board, a bottom of the second end of the metal base contacts a conducting point located on the circuit board to cause the circuit loop into a conducting status, when a current of the circuit loop is overloaded or the circuit loop is over-heated, the bottom of the second end of the metal base is heated so that the bottom of the second end of the metal base separates from the conducting point and the flexible positioning portion wedged with the circuit board, causing the circuit loop to be no longer in the conducting status.

2. The circuit protection element as claimed in claim 1, wherein the dual-metal flake is made of materials of different coefficients of expansion.

3. The circuit protection element as claimed in claim 1, wherein the metal base is fastened onto the circuit board via a rivet.

4. The circuit protection element as claimed in claim 1, wherein the circuit board has an opening that corresponds to the opening slot of the metal base for wedging the positioning portion to the circuit board.

5. The circuit protection element as claimed in claim 1, wherein the opening slot is U-shape or I-shape.

* * * * *